US009818812B2

United States Patent
Kim et al.

(12) United States Patent
(10) Patent No.: US 9,818,812 B2
(45) Date of Patent: Nov. 14, 2017

(54) ORGANIC LIGHT-EMITTING DISPLAY APPARATUS AND METHOD OF MANUFACTURING THE SAME

(71) Applicant: Samsung Display Co., Ltd., Yongin-si, Gyeonggi-do (KR)

(72) Inventors: Daewoo Kim, Yongin-si (KR); Jonghyun Park, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 1 day.

(21) Appl. No.: 14/860,230

(22) Filed: Sep. 21, 2015

(65) Prior Publication Data

US 2016/0204175 A1 Jul. 14, 2016

(30) Foreign Application Priority Data

Jan. 8, 2015 (KR) ........................ 10-2015-0002853

(51) Int. Cl.
*H01L 27/32* (2006.01)

(52) U.S. Cl.
CPC ...... *H01L 27/3258* (2013.01); *H01L 27/3248* (2013.01); *H01L 27/3262* (2013.01); *H01L 27/3265* (2013.01); *H01L 2227/323* (2013.01)

(58) Field of Classification Search
CPC ............. H01L 51/0545; H01L 51/0036; H01L 51/0541; H01L 51/5012
See application file for complete search history.

(56) References Cited

U.S. PATENT DOCUMENTS 7,488,982 B2 * 2/2009 So ........................ H01L 27/3248 257/347
2013/0175533 A1 7/2013 Lee et al.
2014/0061607 A1 * 3/2014 You ..................... H01L 27/3258 257/40

FOREIGN PATENT DOCUMENTS

KR 10-2006-0085491 A 7/2006
KR 10-2013-0080642 A 7/2013
KR 10-2014-0032267 A 3/2014

* cited by examiner

*Primary Examiner* — Quoc Hoang
(74) *Attorney, Agent, or Firm* — Knobbe Martens Olson & Bear LLP

(57) ABSTRACT

An organic light-emitting display apparatus includes a buffer layer formed on a substrate; a gate insulating layer formed over the buffer layer; an interlayer insulating layer formed over the gate insulating layer; a first opening formed through the gate insulating layer and the interlayer insulating layer; a first organic insulating layer formed over the interlayer insulating layer and including a second opening that overlaps with the first opening; a pixel electrode formed in the second opening, and directly contacting the buffer layer; a light emission layer formed over the pixel electrode; and an opposite electrode formed over the light emission layer.

14 Claims, 14 Drawing Sheets

ORGANIC LIGHT-EMITTING DISPLAY APPARATUS AND METHOD OF MANUFACTURING THE SAME

RELATED APPLICATION

This application claims the benefit of Korean Patent Application No. 10-2015-0002853, filed on Jan. 8, 2015, in the Korean Intellectual Property Office, the disclosure of which is incorporated herein in its entirety by reference.

BACKGROUND

1. Field

One or more embodiments relate to an organic light-emitting display apparatus and a method of manufacturing the same.

2. Description of the Related Art

An organic light-emitting display apparatus is a self-emissive display apparatus including a hole injection electrode and an electron injection electrode, and an emission layer formed therebetween, in which holes injected from the hole injection electrode and electrons injected from the electron injection electrode are re-combined in the emission layer so that light is emitted therefrom. The organic light-emitting display apparatus is expected to become a next generation display apparatus due to its high quality characteristic such as low power consumption, high contrast, a fast response time, etc.

SUMMARY

One or more embodiments include an organic light-emitting display apparatus having an improved display quality, and a method of manufacturing the organic light-emitting display apparatus with reduced manufacturing costs.

Additional aspects will be set forth in part in the description which follows and, in part, will be apparent from the description, or may be learned by practice of the presented embodiments.

One aspect provides an organic light-emitting display apparatus, which may comprise: a substrate comprising a major surface; a buffer layer formed over the substrate; a thin-film transistor formed over the buffer layer, and comprising an active layer, a gate electrode, a source electrode, and a drain electrode; a gate insulating layer formed between the active layer and the gate electrode; an interlayer insulating layer formed between the gate electrode and the gate insulating layer such that the gate electrode is disposed between the gate insulating layer and the interlayer insulating layer; a first opening formed through the gate insulating layer and the interlayer insulating layer such that the first opening does not overlap with the thin-film transistor when viewed in a viewing direction perpendicular to the major surface; a first organic insulating layer formed over the interlayer insulating layer and covering the source and drain electrodes, the first organic insulating layer comprising a second opening that overlaps with the first opening when viewed in the viewing direction; a pixel electrode formed in the second opening and directly contacting the buffer layer; a second organic insulating layer formed over the first organic insulating layer and covering edges of the pixel electrode, the second organic insulating layer comprising a third opening that overlaps with the second opening when viewed in the viewing direction; a light emission layer formed over the pixel electrode; and an opposite electrode formed over the emission layer.

In the foregoing apparatus, the pixel electrode may be a transflective electrode, and the opposite electrode is a reflective electrode. The pixel electrode may be formed of a second transparent conductive oxide layer, a transflective metal layer, and a first transparent conductive oxide layer that are sequentially stacked on the substrate. Each of the first and second transparent conductive oxide layers may comprise at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The transflective metal layer may comprise silver (Ag) or a silver alloy. The first opening may be larger than the second opening, and the second opening is larger than the third opening.

Still in the foregoing apparatus, the buffer layer may comprise a silicon oxide layer and a silicon nitride layer that are sequentially stacked over the substrate, wherein the silicon oxide layer is disposed between the substrate and silicon nitride layer. A thickness of the silicon nitride layer may be greater than a thickness of the silicon oxide layer. The first opening may be formed further through the silicon nitride layer, and the pixel electrode directly contacts the silicon oxide layer. The silicon oxide layer may comprise a first portion located between the pixel electrode and the substrate and contacting the pixel electrode, wherein the silicon oxide layer comprises a second portion located between the silicon nitride layer and the substrate, wherein the first portion has a thickness smaller than that of the second portion.

Further in the foregoing apparatus, the buffer layer may comprise a silicon nitride layer, and the pixel electrode directly contacts the silicon nitride layer. The organic light-emitting display apparatus may further comprise a capacitor that comprises a first capacitor electrode formed of the same material as the gate electrode, and a second capacitor electrode formed of the same material as the source electrode. A protective layer may be further disposed over each of the source electrode, the drain electrode, and the second capacitor electrode. The apparatus may further comprise a pad electrode formed of the same material as the source electrode or the drain electrode. The apparatus may further comprise a protective layer disposed over the pad electrode.

Another aspect provides a method of manufacturing an organic light-emitting display apparatus, which may comprise: forming a buffer layer over a substrate comprising a major surface; forming an active layer of a thin-film transistor over the buffer layer; forming a gate insulating layer over the buffer layer and the active layer; forming a gate electrode of the thin-film transistor and a first capacitor electrode of a capacitor over the gate insulating layer; forming an interlayer insulating layer over the gate insulating layer, the gate electrode and the first capacitor electrode; forming a first opening and a contact hole through the interlayer insulating layer and the gate insulating layer, wherein the first opening exposes the buffer layer, and the contact hole exposes a portion of the active layer; forming a source electrode, a drain electrode, and a second capacitor electrode of the capacitor over the interlayer insulating layer; forming a first organic insulating layer over the interlayer insulating layer and covering the source electrode and the drain electrode, the first organic insulating layer covering the buffer layer in the first opening; forming a second opening through the first organic insulating layer in the first opening to expose the buffer layer through the second opening, wherein the second opening overlaps with the first opening; forming a pixel electrode in the second opening, the pixel electrode contacting the buffer layer; and forming a second organic insulating layer over the first organic insulating layer and covering edges of the pixel electrode.

In the foregoing method, forming the buffer layer may comprise sequentially stacking a silicon oxide layer and a silicon nitride layer over the substrate. The method may further comprise, after forming the first opening and the contact hole, performing a Buffered Oxide Etchant (BOE) cleaning process on the first opening and the contact hole. The method may further comprise, after forming the second opening, performing the BOE cleaning process on the second opening. The method may further comprise irradiating laser beams toward the pixel electrode through the substrate and the buffer layer such that a substantial amount of the laser beams reaches a target portion of the pixel electrode to break the target portion.

A further aspect provides an organic light-emitting display apparatus, which may include: a buffer layer formed on a substrate; a gate insulating layer formed over the buffer layer; an interlayer insulating layer formed over the gate insulating layer; a first opening formed through the gate insulating layer and the interlayer insulating layer; a first organic insulating layer formed over the interlayer insulating layer and including a second opening that overlaps with the first opening; a pixel electrode formed in the second opening, and directly contacting the buffer layer; a light emission layer formed over the pixel electrode; and an opposite electrode formed over the light emission layer.

According to one or more embodiments, an organic light-emitting display apparatus includes a buffer layer formed on a substrate; a thin-film transistor formed on the buffer layer, and including an active layer, a gate electrode, a source electrode, and a drain electrode; a gate insulating layer formed between the active layer and the gate electrode; an interlayer insulating layer formed between the gate electrode and the source and drain electrodes; a first opening formed in areas of the gate insulating layer and the interlayer insulating layer that do not overlap with the thin-film transistor, wherein the first opening is commonly formed in the gate insulating layer and the interlayer insulating layer; a first organic insulating layer covering the source and drain electrodes and including a second opening that overlaps with the first opening; a pixel electrode formed in the second opening, and directly contacting the buffer layer; a second organic insulating layer including a third opening that overlaps with the second opening, and covering edges of the pixel electrode; an emission layer formed on the pixel electrode; and an opposite electrode formed on the emission layer.

The pixel electrode may be a transflective electrode, and the opposite electrode may be a reflective electrode.

The pixel electrode may be formed of a second transparent conductive oxide layer, a transflective metal layer, and a first transparent conductive oxide layer that are sequentially stacked on the substrate.

Each of the first and second transparent conductive oxide layers may include at least one material selected from the group consisting of indium tin oxide (ITO), indium zinc oxide (IZO), zinc oxide (ZnO), indium oxide (In2O3), indium gallium oxide (IGO), and aluminum zinc oxide (AZO).

The transflective metal layer may include silver (Ag) or a silver alloy.

The first opening may be larger than the second opening, and the second opening may be larger than the third opening.

The buffer layer may be formed of a silicon oxide layer and a silicon nitride layer that are sequentially stacked on the substrate.

A thickness of the silicon nitride layer may be greater than a thickness of the silicon oxide layer.

The pixel electrode may directly contact the silicon oxide layer.

A thickness of the silicon oxide layer where the silicon oxide layer contacts the pixel electrode may be less than a thickness of the silicon oxide layer where the silicon oxide layer does not contact the pixel electrode.

The buffer layer may include a silicon nitride layer, and the pixel electrode may directly contact the silicon nitride layer.

The organic light-emitting display apparatus may further include a capacitor that includes a first electrode formed from a same layer as the gate electrode, and a second electrode formed from a same layer as the source electrode and the drain electrode.

A protective layer may be further disposed on the source electrode, the drain electrode, and the second electrode of the capacitor.

The organic light-emitting display apparatus may further include a pad electrode formed from a same layer as the source electrode and the drain electrode.

A protective layer may be further disposed on the pad electrode.

According to one or more embodiments, a method of manufacturing an organic light-emitting display apparatus includes operations of performing a first mask process for forming a buffer layer on a substrate and forming an active layer of a thin-film transistor on the buffer layer; performing a second mask process for forming a gate insulating layer and forming a gate electrode of the thin-film transistor and a first electrode of a capacitor on the gate insulating layer; performing a third mask process for forming an interlayer insulating layer and forming a first opening and a contact hole in the interlayer insulating layer, wherein the first opening exposes the buffer layer, and the contact hole exposes a portion of the active layer; performing a fourth mask process for forming a source electrode, a drain electrode, and a second electrode of the capacitor on the interlayer insulating layer; performing a fifth mask process for forming a first organic insulating layer covering the source electrode and the drain electrode and forming a second opening in the first organic insulating layer, wherein the second opening overlaps with the first opening and exposes the buffer layer; performing a sixth mask process for forming a pixel electrode in the second opening; and performing a seventh mask process for forming a second organic insulating layer covering edges of the pixel electrode.

The first mask process may include an operation of forming the buffer layer by sequentially stacking a silicon oxide layer and a silicon nitride layer on the substrate.

After the operation of performing the third mask process, the method may further include an operation of performing a Buffered Oxide Etchant (BOE) cleaning process on the first opening and the contact hole.

After the operation of performing the fifth mask process, the method may further include an operation of performing the BOE cleaning process on the second opening.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
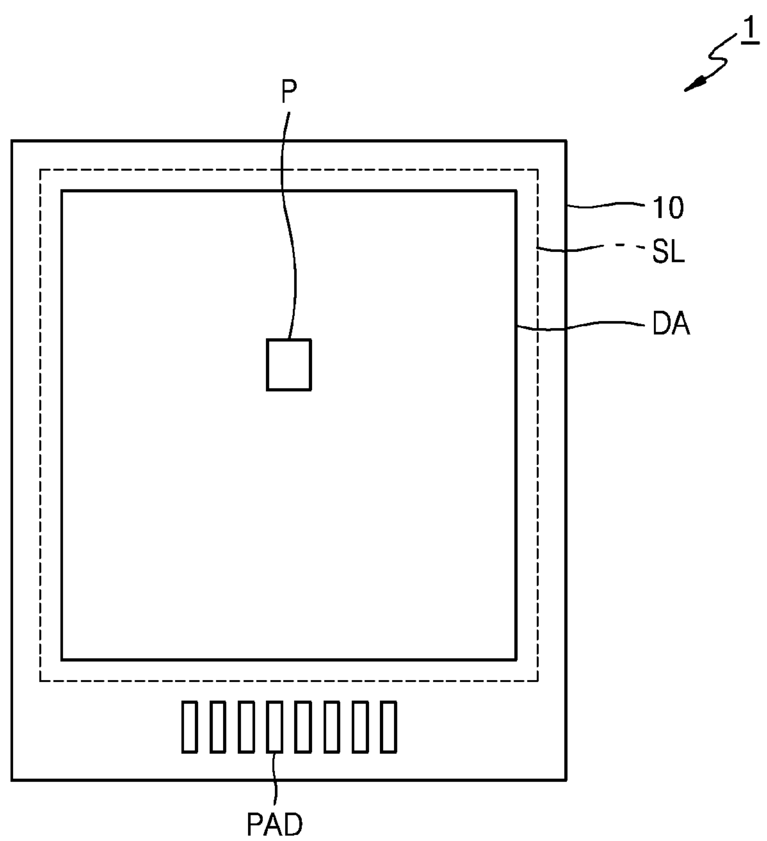
FIG. 1 is a plan view of an organic light-emitting display apparatus according to a first embodiment.

As the inventive concept allows for various changes and numerous embodiments, particular embodiments will be illustrated in the drawings and described in detail in the written description. Effects and features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein.

Hereinafter, one or more embodiments will be described below in more detail with reference to the accompanying drawings. Those components that are the same or are in correspondence are rendered the same reference numeral regardless of the figure number, and redundant explanations are omitted.

Hereinafter, in one or more embodiments, while such terms as "first," "second," etc., may be used, such components must not be limited to the above terms, and the above terms are used only to distinguish one component from another.

Hereinafter, in one or more embodiments, a singular form may include plural forms, unless there is a particular description contrary thereto.

Hereinafter, in one or more embodiments, terms such as "comprise" or "comprising" are used to specify existence of a recited feature or component, not excluding the existence of one or more other recited features or one or more other components.

Hereinafter, in one or more embodiments, it will also be understood that when an element such as layer, region, or component is referred to as being "on" another element, it can be directly on the other element, or intervening elements such as layer, region, or component may also be interposed therebetween.

In the drawings, for convenience of description, the sizes of layers and regions are exaggerated for clarity. For example, a size and thickness of each element may be random for convenience of description, thus, one or more embodiments are not limited thereto.

As used herein, the term "and/or" includes any and all combinations of one or more of the associated listed items.

Figure 2:
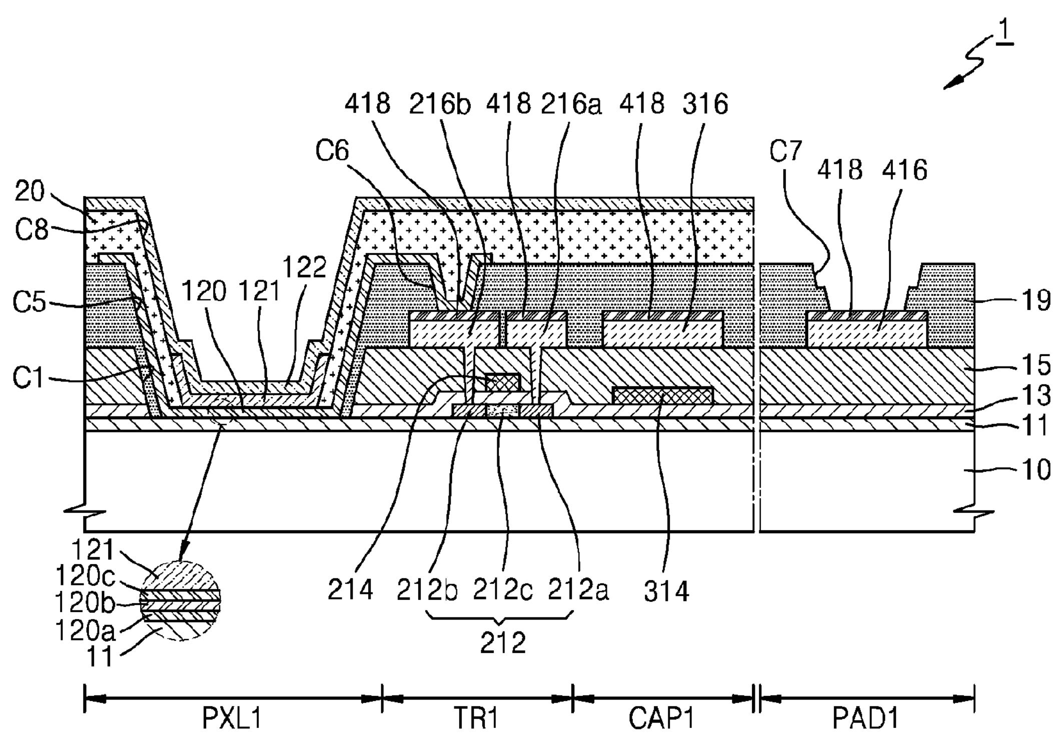
FIG. 2 is a cross-sectional view illustrating a portion of an emission pixel and a portion of a pad of the organic light-emitting display apparatus according to the first embodiment.

FIG. 1 is a plan view of an organic light-emitting display apparatus 1 according to a first embodiment. FIG. 2 is a cross-sectional view illustrating a portion of an emission pixel and a portion of a pad of the organic light-emitting display apparatus 1 according to the first embodiment.

Referring to FIG. 1, the organic light-emitting display apparatus 1 includes a display area DA on a substrate 10, and the display area DA includes a plurality of pixels P and thus displays an image. The display area DA is formed within a sealing line SL, and an encapsulation member is arranged to encapsulate the display area DA along the sealing line SL.

Referring to FIG. 2, in embodiments, each pixel may include a pixel region PXL1 having at least one emission layer 121, a thin-film transistor region TR1 having at least one thin-film transistor, and a capacitor region CAP1 having at least one capacitor. The apparatus includes a pad region PAD1 arranged on the substrate 10.

In the thin-film transistor region TR1, an active layer 212 of the thin-film transistor is arranged above the substrate 10 and a buffer layer 11.

The substrate 10 may be formed as a glass substrate or a plastic substrate including polyethylene terephthalate (PET), polyethylene naphthalate (PEN), polyimide, or the like.

The buffer layer 11 may be arranged on the substrate 10 so as to form a planar surface on the substrate 10 and to reduce or minimize penetration of foreign substances. As will be described later, the buffer layer 11 may be formed of a silicon oxide layer 11*b* (refer to FIG. 5B) and a silicon nitride layer 11*a* (refer to FIG. 5B) that are sequentially stacked on the substrate 10.

The active layer 212 is arranged on the buffer layer 11 in the thin-film transistor region TR1. The active layer 212 may be formed of a semiconductor including amorphous silicon or polysilicon. The active layer 212 may include a channel region 212*c*, and a source region 212*a* and a drain region 212*b* that are arranged at both sides of the channel region 212*c* and are doped with impurity. A material of the active layer 212 is not limited to amorphous silicon or polysilicon and may include an oxide semiconductor.

A gate insulating layer 13 is arranged on the active layer 212. The gate insulating layer 13 may be formed as a single layer or multiple layers including silicon nitride and/or silicon oxide.

A gate electrode 214 is arranged on the gate insulating layer 13. The gate electrode 214 may be formed as a single layer or multiple layers including at least one metal material selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

In embodiments, an electrically conductive line or conductor line such as a scan line may be formed from a same layer as the gate electrode 214 by using a same material as the gate electrode 214. As a size of a screen of the organic light-emitting display apparatus 1 is increased, it is required to increase a thickness of the conductor line so as to reduce or minimize a signal delay due to the large screen. In the present embodiment, a thickness of the gate electrode 214 and the conductor line may be set between about 6,000 and about 12,000 Å. When the thickness of the gate electrode 214 and the conductor line is equal to or greater than at least 6,000 Å, the signal delay may be reduced or minimized in a large screen of at least 50 inches. In this regard, it is difficult to form the thickness of the gate electrode 214 and the conductor line to be greater than 12,000 Å by deposition.

An interlayer insulating layer 15 is deposited on the gate electrode 214. The interlayer insulating layer 15 may be formed as a single layer or multiple layers including silicon nitride and/or silicon oxide.

A source electrode 216*a* and a drain electrode 216*b* are arranged on the interlayer insulating layer 15. Each of the source electrode 216*a* and the drain electrode 216*b* may be formed as a single layer or multiple layers including at least one metal material selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), copper (Cu), and an alloy thereof.

A protective layer 418 may be formed on each of the source electrode 216*a* and the drain electrode 216*b*. The protective layer 418 protects the source electrode 216*a* and the drain electrode 216*b* from being exposed to etchant while a pixel electrode 120 is etched, so that a particle defect may be reduced or minimized.

Since the protective layer 418 and the source electrode 216*a*, and the protective layer 418 and the drain electrode 216*b* are etched by using a same mask, etched surfaces of edges of the protective layer 418 and the source electrode 216*a* may be equal to each other, and etched surfaces of edges of the protective layer 418 and the drain electrode 216*b* may be equal to each other.

A first organic insulating layer 19 that covers the source electrode 216*a* and the drain electrode 216*b* is disposed on the source electrode 216*a* and the drain electrode 216*b*. A second organic insulating layer 20 is arranged on the first organic insulating layer 19. The first organic insulating layer 19 and the second organic insulating layer 20 may include polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof.

The pixel electrode 120 contacts one of the source electrode 216*a* and the drain electrode 216*b* via a contact hole C6 formed in the first organic insulating layer 19.

The pixel electrode 120 is arranged on the buffer layer 11 in the pixel region PXL1.

The pixel electrode 120 includes a transflective metal layer 120*b*. In embodiments, the transflective metal layer 120*b* is capable of partially transmitting light incident thereto and partially reflecting the light incident thereto. Also, the pixel electrode 120 may further include a first transparent conductive oxide layer 120*a* and a second transparent conductive oxide layer 120*c* that are formed below and on the transflective metal layer 120*b*, respectively.

The transflective metal layer 120*b* may be formed of Ag or a silver alloy. The transflective metal layer 120*b* and an opposite electrode 122 that is a reflective electrode to be described later may form a micro-cavity structure and thus may improve a luminescent efficiency of the organic light-emitting display apparatus 1.

Each of the first and second transparent conductive oxide layers 120*a* and 120*c* may include at least one material selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The first transparent conductive oxide layer 120*a* may reinforce adhesion between the buffer layer 11 and the transflective metal layer 120*b*, and the second transparent conductive oxide layer 120*c* may function as a barrier layer for protecting the transflective metal layer 120*b*.

A metal material such as silver that is highly reducible and forms the transflective metal layer 120*b* may cause a problem by which a silver particle is extracted while the pixel electrode 120 is etched. The extracted silver particle may be a main factor of a particle defect that causes a dark spot. While the pixel electrode 120 including silver is etched, if the source electrode 216*a*, the drain electrode 216*b*, a pad electrode 416, or the conductor line is exposed to an etchant, silver ion that is highly reducible may receive an electron from the aforementioned metal materials and may be re-extracted as a silver particle.

However, in the organic light-emitting display apparatus 1 according to the present embodiment, the source electrode 216*a*, the drain electrode 216*b*, and the pad electrode 416 are protected by the protective layer 418 and thus are not exposed to the etchant. Therefore, the particle defect due to the re-extraction of the silver particle may be reduced or minimized.

In the pixel region PXL1, the gate insulating layer 13 and the interlayer insulating layer 15 on the buffer layer 11 are simultaneously etched, so that a hole or a trench that is a first opening C1 is formed to expose the buffer layer 11. The first opening C1 is formed in an area that does not overlap with the thin-film transistor and a capacitor to be described later.

A second opening C5 overlaps with the first opening C1. When the first organic insulating layer 19 is etched, a trench is resulted therefrom. The trench corresponds to the second opening C5 that exposes the buffer layer 11. A width of the second opening C5 is smaller than a width of the first opening C1.

The pixel electrode 120 is disposed in the second opening C5. Edges of the pixel electrode 120 are formed on the first organic insulating layer 19 that is outside the second opening C5. As the edges of the pixel electrode 120 extend on the first organic insulating layer 19 outside the second opening C5, light that is emitted from the emission layer 121 is partly refracted and/or reflected at an interface between the light and the edges of the pixel electrode 120 and thus is discharged toward the substrate 10, so that a luminescent efficiency of an organic light-emitting display apparatus such as the organic light-emitting display apparatus 1 according to the present embodiment is improved.

The edges of the pixel electrode 120 are covered by the second organic insulating layer 20. A third opening C8 that overlaps with the first opening C1 and the second opening C5 is formed in the second organic insulating layer 20, and a width of the third opening C8 is smaller than a width of the second opening C5.

In embodiments, an opening may include a hole, a trench or an aperture formed through a layer, and another layer or structure may be received or filled in that opening in later manufacturing process or in a final product. In the illustrated embodiments, portions of the first and second organic insulating layers 19 and 20, the pixel electrode 120, the light emission layer 121 and the opposite electrode 122 are received within the first opening C1, and the second opening C5 is formed within the first opening C1. Further, the portion of the second organic insulating layer 20, the pixel electrode 120, the light emission layer 121 and the opposite electrode 122 are received within the second opening C5, and the third opening C8 is formed within the first and second openings C1 and C5. Additionally, the pixel electrode 120, the light emission layer 121 and the opposite electrode 122 are received within the third opening C8.

An intermediate layer that includes the emission layer 121 is arranged on the pixel electrode 120 whose top surface is exposed by the second opening C8 formed in the second organic insulating layer 20. The emission layer 121 may include a small molecule organic material or a polymer organic material.

If the emission layer 121 includes the small molecule organic material, the intermediate layer may further include a hole transport layer (HTL), a hole injection layer (HIL), an electron transport layer (ETL), or an electron injection layer (EIL). In addition to these layers, if required, the intermediate layer may further include various layers. Here, various organic materials including copper phthalocyanine (CuPc), N,N'-Di(naphthalene-1-yl)-N,N'-diphenyl-benzidine (NPB), tris-8-hydroxyquinoline aluminum)(Alq3), or the like may be used.

If the emission layer 121 includes the polymer organic material, the intermediate layer may further include an HTL. The HTL may be formed of poly-(2,4)-ethylene-dihydroxy thiophene (PEDOT) or polyaniline (PANI). Here, the polymer organic material may include poly-phenylene vinylene (PPV), polyfluorene, or the like. Also, an inorganic material may be further arranged between the emission layer 121 and pixel electrode 120 and may be further arranged between the emission layer 121 and the opposite electrode 122.

Referring to FIG. 2, the emission layer 121 is disposed in the third opening C8 but this is only for convenience of description and one or more embodiments are not limited thereto. The emission layer 121 may be formed not only in the third opening C8 but may also extend to a top surface of the second organic insulating layer 20 along an etched surface of the third opening C8 formed in the second organic insulating layer 20.

The opposite electrode 122 that is commonly formed in pixels is arranged on the emission layer 121. In the organic light-emitting display apparatus 1 according to the present embodiment, the pixel electrode 120 is used as an anode and the opposite electrode 122 is used as a cathode but polarities of electrodes may be switched.

The opposite electrode 122 may be the reflective electrode including a reflective material. The opposite electrode 122 may include at least one material selected from Al, Mg, Li, Ca, LiF/Ca, and LiF/Al. Since the opposite electrode 122 is formed as the reflective electrode, light that is emitted from the emission layer 121 is reflected from the opposite electrode 122 and thus is discharged toward the substrate 10 via the pixel electrode 120 formed of translucent metal.

In the micro-cavity structure, a material and a thickness of an insulating layer between the substrate 10 and the pixel electrode 120 that is a transflective electrode may affect a resonance distance, and thus may have an effect on the luminescent efficiency of the organic light-emitting display apparatus 1.

Figure 10:
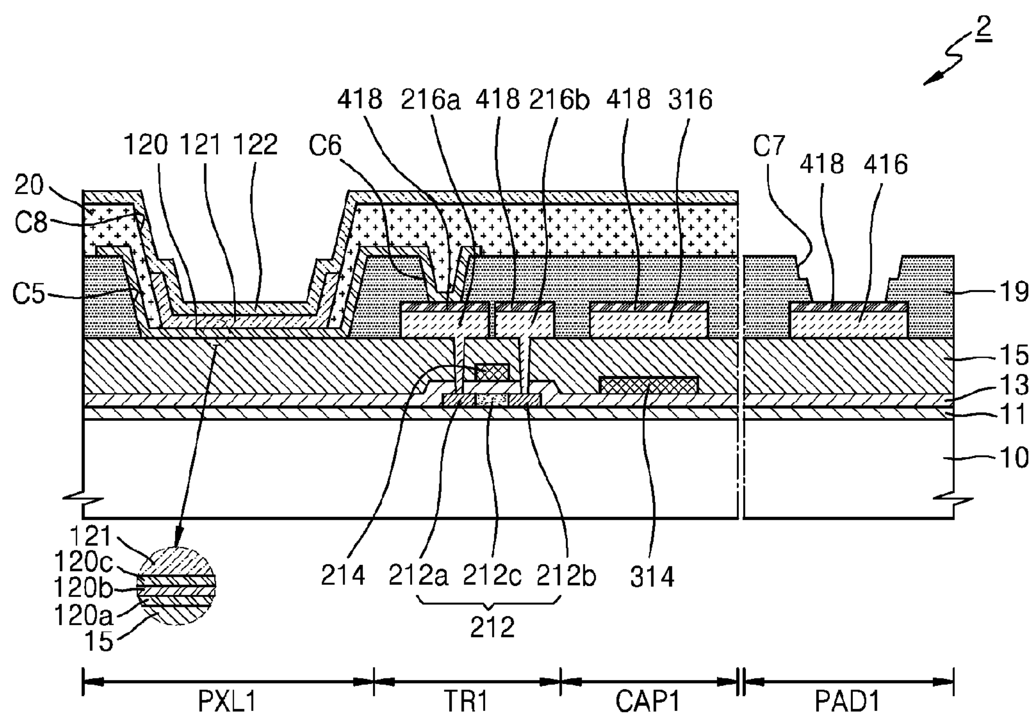
FIG. 10 is a cross-sectional view illustrating a portion of an emission pixel and a portion of a pad of an organic light-emitting display apparatus according to a comparative example.

FIG. 10 is a cross-sectional view illustrating a portion of an emission pixel and a portion of a pad of an organic light-emitting display apparatus 2 according to a comparative example.

Compared to the organic light-emitting display apparatus 1 according to the present embodiment, the organic light-emitting display apparatus 2 according to the comparative example has a difference in a structure of an insulating layer between the substrate 10 and the pixel electrode 120, and other configurations are same.

In embodiments, in the organic light-emitting display apparatus 1 according to the present embodiment, only the buffer layer 11 is disposed between the substrate 10 and the pixel electrode 120, but in the organic light-emitting display apparatus 2 according to the comparative example, the buffer layer 11, the gate insulating layer 13, and the interlayer insulating layer 15 are disposed between the substrate 10 and the pixel electrode 120.

In the organic light-emitting display apparatus 2 according to the comparative example, the pixel electrode 120 is a transflective electrode including the first transparent conductive oxide layer 120*a*, the transflective metal layer 120*b*, and the second transparent conductive oxide layer 120*c*, and the opposite electrode 122 is formed as a reflective electrode, so that a micro-cavity structure is applied to the comparative example.

Also, likewise to the organic light-emitting display apparatus 1 according to the present embodiment, the organic light-emitting display apparatus 2 according to the comparative example is manufactured via seven mask processes.

In the organic light-emitting display apparatus 2 according to the comparative example, the buffer layer 11 including a silicon oxide layer of 3,000 Å, the gate insulating layer 13 including a silicon oxide layer of 750 Å and a silicon nitride layer of 400 Å, and the interlayer insulating layer 15 including a silicon nitride layer of 3,000 Å and a silicon oxide layer of 3,000 Å are sequentially stacked between the substrate 10 and the pixel electrode 120, and thus form a resonance structure.

A pixel repair line 120-1 may be a part of the pixel electrode 120 or may be formed from the same material layer as the pixel electrode 120.

Figure 11:
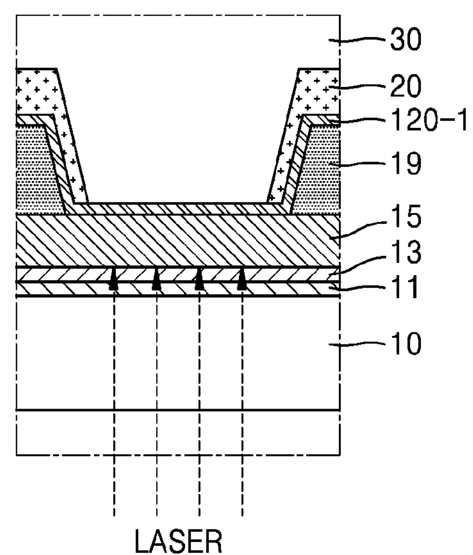
FIG. 11 is a cross-sectional view of the organic light-emitting display apparatus in which a laser is irradiated to a pixel repair line, according to the comparative example.

When a lighting error occurs at the organic light-emitting display apparatus 2, a repair laser is irradiated from the substrate 10 to a pixel repair line 120-1 (refer to FIG. 12), and the pixel repair line 120-1 is an area having the lighting error is removed, so that a defective pixel is repaired. However, as illustrated in FIG. 11, in the organic light-emitting display apparatus 2 according to the comparative example, a repair laser cannot pass through the interlayer insulating layer 15 and thus cannot repair a pixel repair line 120-1.

Figure 12:
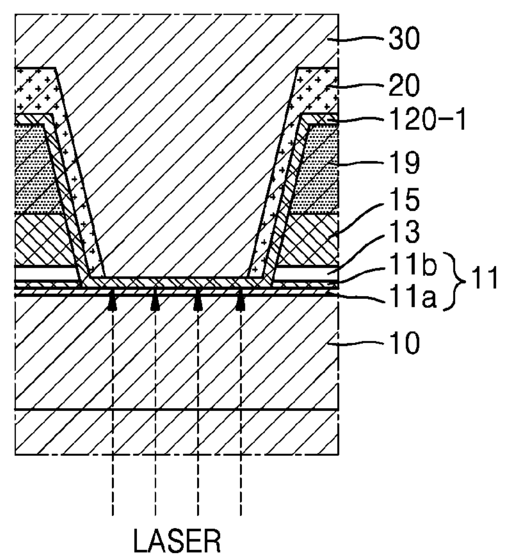
FIG. 12 is a cross-sectional view of the organic light-emitting display apparatus in which a laser is irradiated to a pixel repair line, according to an embodiment.

FIG. 12 is a cross-sectional view of the organic light-emitting display apparatus 1 in which a laser is irradiated to the pixel repair line 120-1, according to an embodiment.

The organic light-emitting display apparatus 1 according to the present embodiment has a resonance structure in a manner that the buffer layer 11 including a silicon nitride layer of 3,000 Å and a silicon oxide layer of 1,000 Å is formed between the substrate 10 and the pixel electrode 120.

Since a gate insulating layer and an interlayer insulating layer are not formed in an emission area of the organic light-emitting display apparatus 1 according to the present embodiment, a thickness of an insulating layer between the substrate 10 and the pixel electrode 120 is less than a thickness of the comparative example by about 6,000 through 7,000 Å. However, a change in the insulating layer as in the organic light-emitting display apparatus 1 according to the present embodiment did not particularly affect resonance of an organic light-emitting device. On the other hand, since the repair laser passes through the buffer layer 11 and reaches the pixel repair line 120-1, the repair laser can repair the pixel repair line 120-1. Therefore, a yield rate of a repaired organic light-emitting device may be improved.

The capacitor region CAP1 has a capacitor including a first electrode 314 formed from a same layer as the gate electrode 214, and a second electrode 316 formed from a same layer as the source electrode 216*a* and the drain electrode 216*b*. The interlayer insulating layer 15 is disposed between the first electrode 314 and the second electrode 316.

The first electrode 314 may be formed of a same material as the gate electrode 214.

The protective layer 418 may be formed on the second electrode 316. The protective layer 418 protects the second electrode 316 from being exposed to an etchant while the pixel electrode 120 is etched, so that a particle defect may be reduced or minimized.

Since the protective layer 418 and the second electrode 316 are etched by using a same mask, etched surfaces of edges of the protective layer 418 and the second electrode 316 may be equal to each other.

In the pad region PAD1 that is an outer region of the display area DA, the pad electrode 416 that is a connection terminal of an external driver is positioned.

The pad electrode 416 is disposed on the interlayer insulating layer 15, and edges of the pad electrode 416 are covered with the first organic insulating layer 19.

The pad electrode 416 is formed of a same material as the source electrode 216*a* and the drain electrode 216*b*, and the protective layer 418 is formed on the pad electrode 416. The protective layer 418 protects the pad electrode 416 from being exposed to an etchant while the pixel electrode 120 is etched, so that a particle defect may be reduced or minimized. Also, the protective layer 418 protects the pad electrode 416 from being exposed to moisture and oxygen, so that it is possible to increase or enhance reliability of a pad.

Since the protective layer 418 and the pad electrode 416 are etched by using a same mask, etched surfaces of edges of the protective layer 418 and the pad electrode 416 may be equal to each other.

In embodiments, the organic light-emitting display apparatus 1 may further include an encapsulation member 30 (refer to FIG. 12) that encapsulates the pixel region PXL1, the capacitor region CAP1, and the thin-film transistor region TR1. The encapsulation member 30 may be formed as a substrate including a glass material, a metal film, or an encapsulation thin film formed of an organic insulating film and an inorganic insulating film that are alternately stacked.

Hereinafter, a method of manufacturing the organic light-emitting display apparatus 1 will be described with reference to FIGS. 3 through 9.

Figure 3:
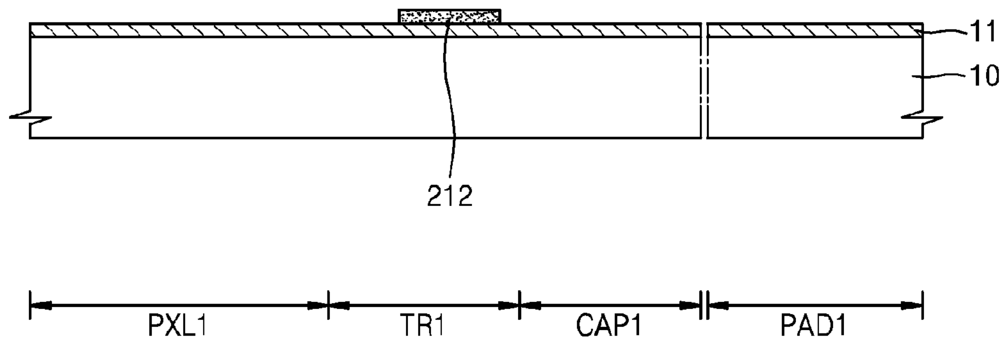
FIG. 3 is a cross-sectional view illustrating a first process for the organic light-emitting display apparatus, according to an embodiment.

FIG. 3 is a cross-sectional view illustrating a first process for the organic light-emitting display apparatus 1, according to an embodiment.

Referring to FIG. 3, the buffer layer 11 is formed on the substrate 10, and a semiconductor layer is formed on the buffer layer 11 and then is patterned so as to form the active layer 212 of a thin-film transistor.

The buffer layer 11 may be formed as the silicon oxide layer 11*b* (refer to FIG. 5B) and the silicon nitride layer 11*a* (refer to FIG. 5B) that are sequentially stacked on the substrate 10.

In embodiments, after photoresist is coated on the semiconductor layer, the semiconductor layer is patterned via a photolithography process using a first photomask, so that the active layer 212 is formed. The photolithography process is processed in a manner that the first photomask is exposed by an exposure device, and then developing, etching, and stripping or ashing processes are sequentially performed.

The semiconductor layer may be formed of amorphous silicon or poly silicon. Here, the poly silicon may be formed by crystallizing the amorphous silicon. The crystallization of the amorphous silicon may be performed by using various methods including a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and the like. However, a method for the semiconductor layer is not limited to the amorphous silicon or the poly silicon and may include an oxide semiconductor.

Figure 4:
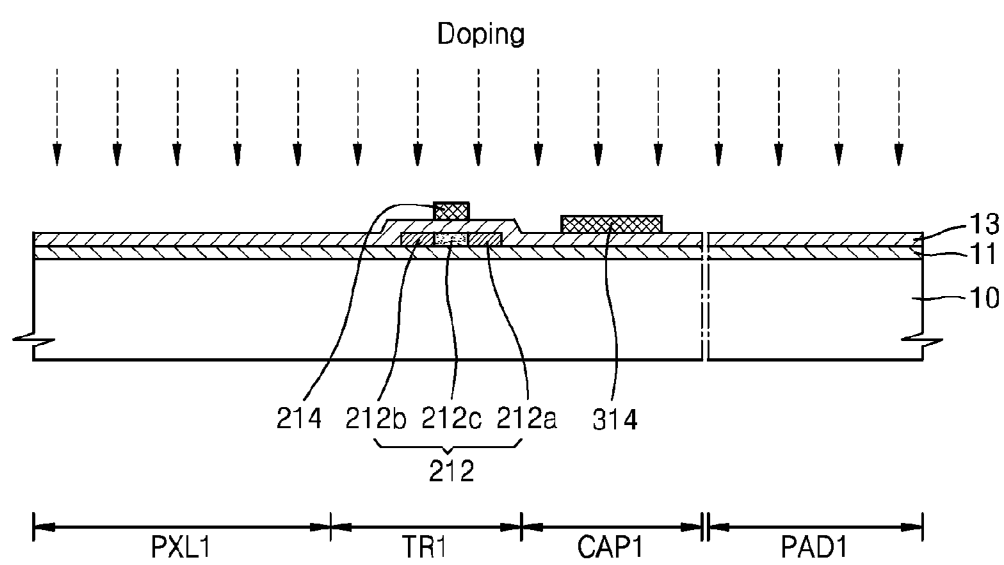
FIG. 4 is a cross-sectional view illustrating a second process for the organic light-emitting display apparatus, according to an embodiment.

FIG. 4 is a cross-sectional view illustrating a second process for the organic light-emitting display apparatus 1, according to an embodiment.

The gate insulating layer 13 is formed on the resultant of the first process shown in FIG. 3, and a first metal layer is formed on the gate insulating layer 13 and is patterned. The first metal layer may be formed as a single layer or multiple layers including at least one metal material selected from Al, Pt, Pd, Ag, Mg, Au, Ni, Nd, Ir, Cr, Li, Ca, Mo, Ti, W, and Cu.

As a patterning result, the gate electrode 214 and the first electrode 314 of the capacitor are formed on the gate insulating layer 13.

Ion impurity is doped on the aforementioned structure. The ion impurity including b-type ion or p-type ion may be doped, and in more detail, the ion impurity with a density of at least $1\times10^{15}$ atoms/$cm^2$ is doped while targeting the active layer 212 of the thin-film transistor.

The active layer 212 is doped with the ion impurity by using the gate electrode 214 as a self-align mask, so that the active layer 212 has the source region 212*a* and the drain region 212*b*, and the channel region 212*c* therebetween that are doped with the ion impurity.

Figure 5A:
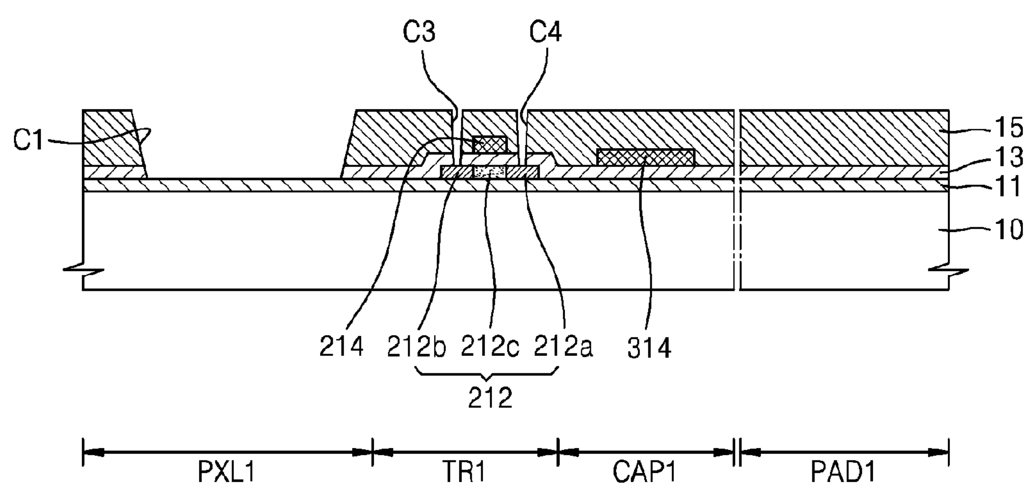
FIGS. 5A and 5B are cross-sectional views illustrating a resultant of a third process for the organic light-emitting display apparatus, according to an embodiment.
Figure 5B:
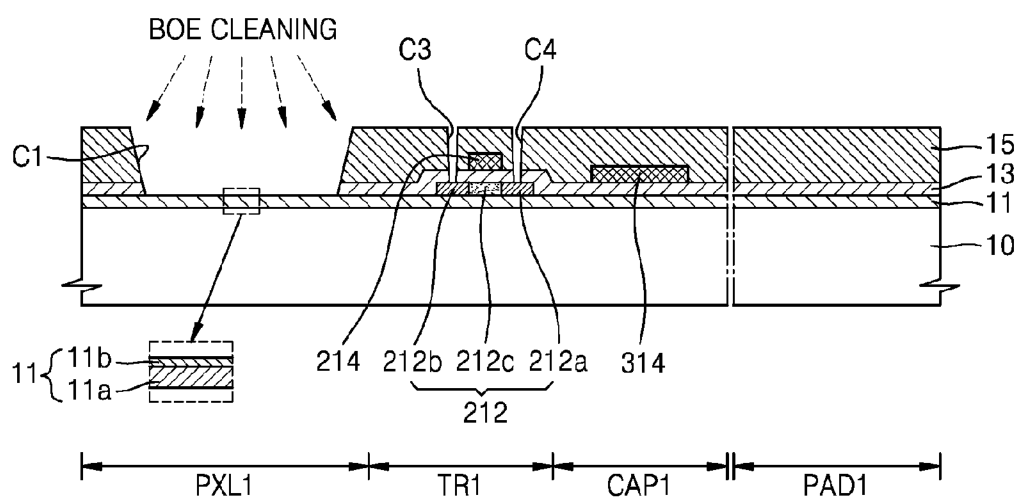

FIGS. 5A and 5B are cross-sectional views illustrating a resultant of a third process for the organic light-emitting display apparatus 1, according to an embodiment.

Referring to FIG. 5A, the interlayer insulating layer 15 is formed on a resultant of the second process shown in FIG. 4, and is patterned so as to form a first opening C1 for exposing an area to be an emission portion, and openings C3 and C4 for exposing the source region 212*a* and the drain region 212*b* of the active layer 212.

The first opening C1 is formed by simultaneously etching the gate insulating layer 13 and the interlayer insulating layer 15, and exposes the buffer layer 11.

Referring to FIG. 5B, a Buffered Oxide Etchant (BOE) cleaning process may be performed on a structure of FIG. 5A.

If the buffer layer 11 is formed as the silicon oxide layer 11*b* and the silicon nitride layer 11*a* that are sequentially stacked on the substrate 10, a surface of the silicon oxide layer 11*b* is partially etched, so that a thickness of the silicon oxide layer 11*b* is less than a thickness of the silicon nitride layer 11*a*.

Since the BOE cleaning process is performed, a surface roughness of the buffer layer 11 may be decreased, and a thickness of the buffer layer 11 is further decreased, so that a repair laser may pass through the buffer layer 11.

Figure 6:
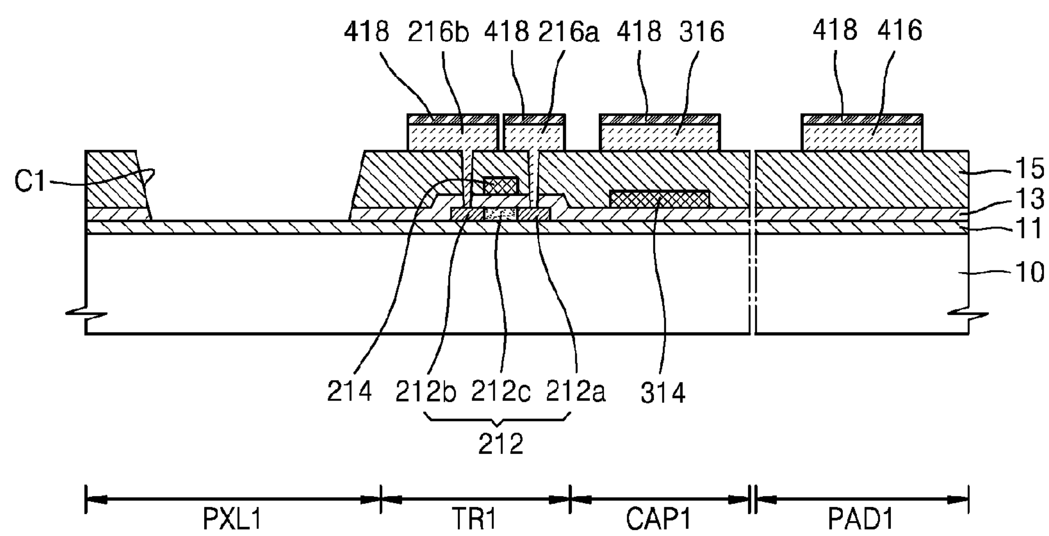
FIG. 6 is a cross-sectional view illustrating a fourth process for the organic light-emitting display apparatus, according to an embodiment.

FIG. 6 is a cross-sectional view illustrating a fourth process for the organic light-emitting display apparatus 1, according to an embodiment.

Referring to FIG. 6, a second metal layer and the protective layer 418 are formed on the resultant of the third process shown in FIG. 5B and are patterned so as to simultaneously form the source electrode 216*a* and the protective layer 418, the drain electrode 216*b* and the protective layer 418, the second electrode 316 of the capacitor and the protective layer 418, and the pad electrode 416 and the protective layer 418.

The second metal layer may be at least two different metal layers having different electron mobilities. For example, the second metal layer may be formed as at least two different metal layers including metal materials selected from Al, Pt, Pd, Ag, Mg, Au, Ni, Nd, Ir, Cr, Li, Ca, Mo, Ti, W, Cu, and an alloy thereof.

The protective layer 418 may be formed as a transparent conductive oxide layer including at least one material selected from the group consisting of ITO, IZO, ZnO, $In_2O_3$, IGO, and AZO.

Figure 7A:
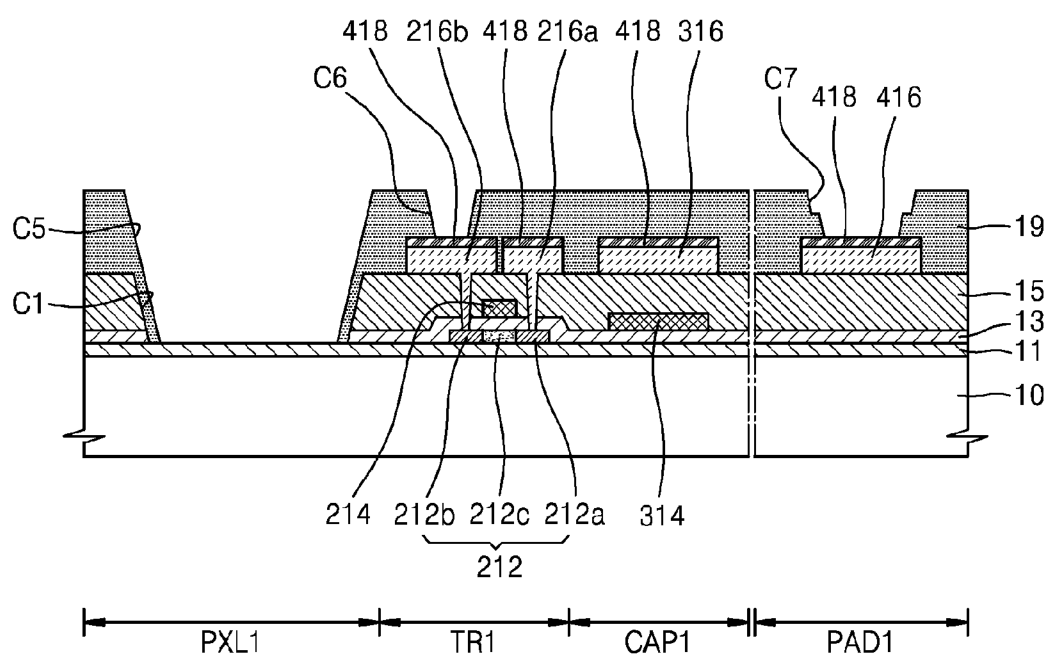
FIGS. 7A and 7B are cross-sectional views illustrating a fifth process for the organic light-emitting display apparatus, according to an embodiment.
Figure 7B:
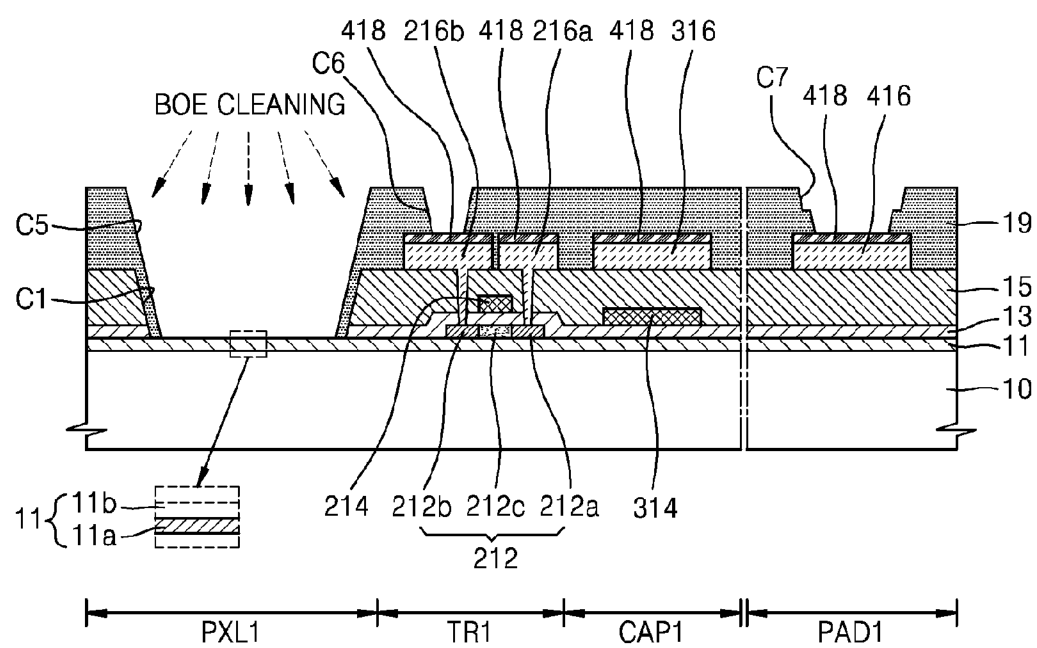

FIGS. 7A and 7B are cross-sectional views illustrating a fifth process for the organic light-emitting display apparatus 1, according to an embodiment.

Referring to FIG. 7A, the first organic insulating layer 19 is formed on the resultant of the fourth process shown in FIG. 6 and is patterned, so that the contact hole C6, a contact hole C7 for exposing a top surface of the protective layer 418 on the pad electrode 416, and the second opening C5 in the pixel region PXL1 are formed, wherein the pixel electrode 120 is to be disposed in the pixel region PXL1.

The second opening C5 is formed in an area that does not overlap with the thin-film transistor and the capacitor and overlaps the first opening C1. A width of the second opening C5 is smaller than a width of the first opening C1.

Referring to FIG. 7B, a second BOE cleaning process may be performed on a structure of FIG. 7A.

If the second BOE cleaning process is performed after the first BOE cleaning process is performed, the silicon oxide layer 11*b* that is an upper portion of the buffer layer 11 may be completely removed. Due to the second BOE cleaning process, the surface roughness of the buffer layer 11 may be further decreased, and the thickness of the buffer layer 11 is further decreased, so that the repair laser may pass through the buffer layer 11 without a problem.

Figure 8:
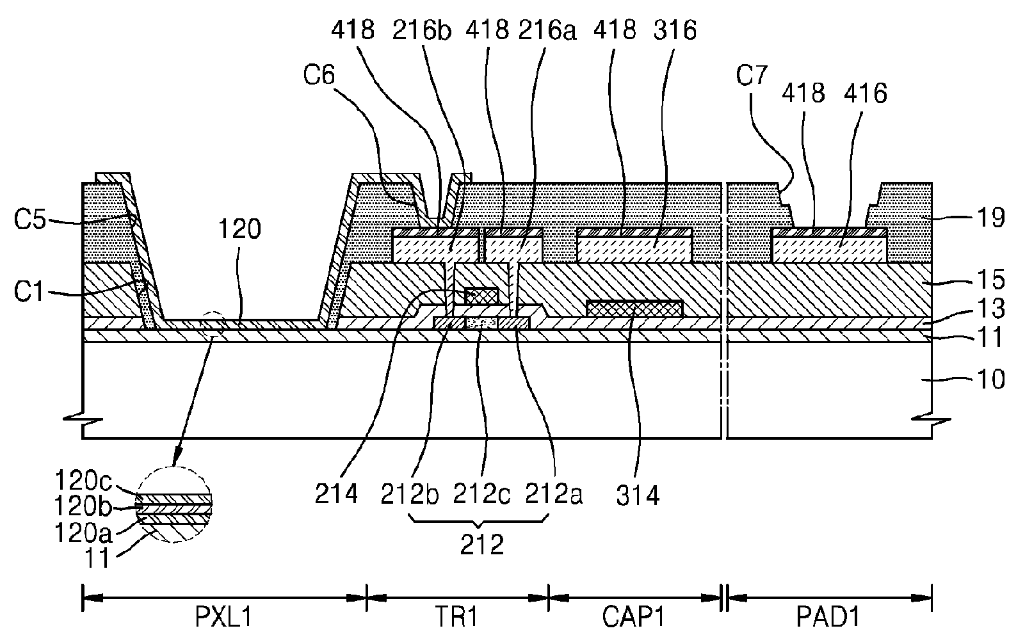
FIG. 8 is a cross-sectional view illustrating a sixth process for the organic light-emitting display apparatus, according to an embodiment.

FIG. 8 is a cross-sectional view illustrating a sixth process for the organic light-emitting display apparatus 1, according to an embodiment.

Referring to FIG. 8, the second transparent conductive oxide layer 120*c*, the transflective metal layer 120*b*, and the first transparent conductive oxide layer 120*a* are deposited and patterned on the resultant of the fifth process shown in FIG. 7B, so that the pixel electrode 120 is formed.

The pixel electrode 120 directly contacts a top surface of the buffer layer 11.

If only the first BOE cleaning process is performed and the second BOE cleaning process is not performed, the pixel electrode 120 directly contacts the silicon nitride layer 11*a* of the buffer layer 11 of FIG. 5B that is close to the substrate 10 and has a thickness less than a thickness of the silicon oxide layer 11*b*.

If the first BOE cleaning process and the second BOE cleaning process are all performed, the pixel electrode 120 directly contacts the buffer layer 11 of FIG. 7B that only has the silicon oxide layer 11*b* on the substrate 10.

Edges of the pixel electrode 120 are formed on the first organic insulating layer 19 that is outside the second opening C5. As the edges of the pixel electrode 120 extend on the first organic insulating layer 19 outside the second opening C5, light that is emitted from the emission layer 121 is partly refracted and/or reflected at an interface between the light and the edges of the pixel electrode 120 and thus is discharged toward the substrate 10, so that a luminescent efficiency of an organic light-emitting display apparatus such as the organic light-emitting display apparatus 1 according to the present embodiment is improved.

Figure 9:
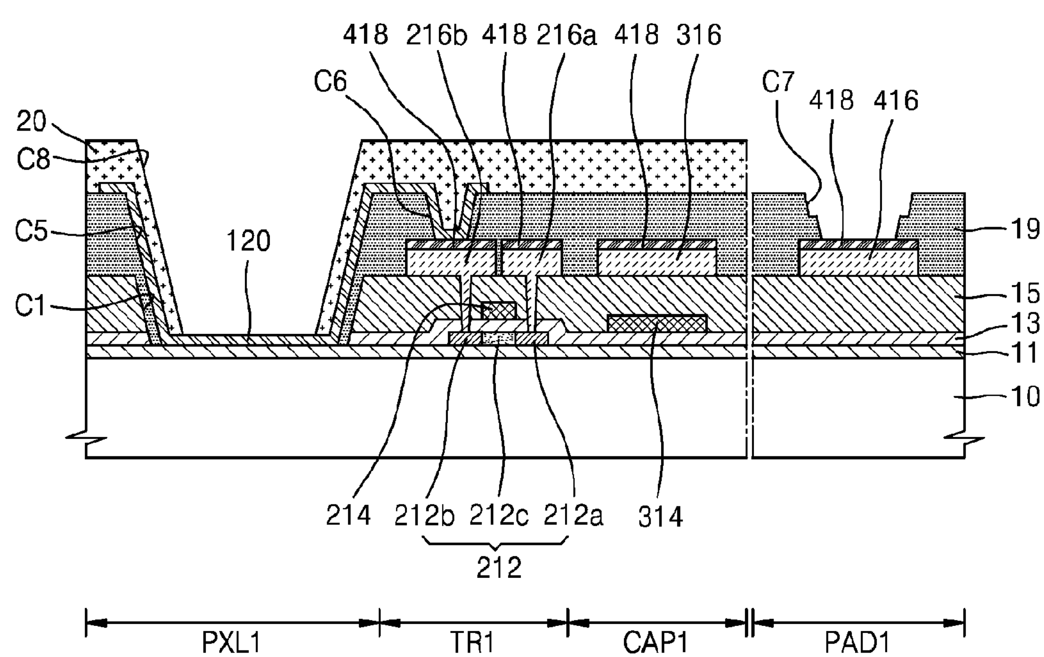
FIG. 9 is a cross-sectional view illustrating a seventh process for the organic light-emitting display apparatus, according to an embodiment.

FIG. 9 is a cross-sectional view illustrating a seventh process for the organic light-emitting display apparatus 1, according to an embodiment.

Referring to FIG. 9, the seventh process is performed to form the second organic insulating layer 20 on the resultant of the sixth process shown in FIG. 8 and then to form the third opening C8 for exposing a top surface of the pixel electrode 120.

The second organic insulating layer 20 functions as a pixel defining layer and may be formed as an organic insulating layer including polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof.

An intermediate layer including the emission layer 121 (refer to FIG. 2) is formed on the resultant of the seventh process shown in FIG. 9, and the opposite electrode 122 (refer to FIG. 2) is formed.

In the organic light-emitting display apparatus 1 according to the first embodiment, the pixel electrode 120 includes the transflective metal layer 120*b*, so that a luminescent efficiency of the organic light-emitting display apparatus 1 may be improved due to a micro-cavity structure.

Also, the BOE cleaning process may be performed to decrease the surface roughness of the buffer layer 11.

Also, since the thickness of the buffer layer 11 is decreased, a repair laser may pass through the buffer layer 11 without a problem, so that a yield rate of an organic light-emitting device may be improved.

Also, since the first organic insulating layer 19 covers the source electrode 216*a* or the drain electrode 216*b*, so that the source electrode 216*a* or the drain electrode 216*b* is not exposed to the etchant including silver ion, thus, the particle defect due to re-extraction of silver may be reduced or minimized.

Also, since the organic light-emitting display apparatus 1 is manufactured through the seven mask processes, the manufacturing costs may be reduced.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:

a substrate comprising a major surface;

a buffer layer formed over the substrate;

a thin-film transistor formed over the buffer layer, and comprising an active layer, a gate electrode, a source electrode, and a drain electrode;

a gate insulating layer formed between the active layer and the gate electrode;

an interlayer insulating layer formed between the gate electrode and the gate insulating layer such that the gate electrode is disposed between the gate insulating layer and the interlayer insulating layer;

a first opening formed through the gate insulating layer and the interlayer insulating layer, wherein the first opening does not overlap with the thin-film transistor when viewed in a viewing direction perpendicular to the major surface;

a first organic insulating layer formed over the interlayer insulating layer and covering the source and drain electrodes, the first organic insulating layer comprising a second opening that overlaps with the first opening when viewed in the viewing direction, the first organic insulating layer further comprising a contact hole overlapping one of the source and drain electrodes;

a pixel electrode formed in the second opening, and directly contacting the buffer layer, the pixel electrode further formed inside the contact hole of the first organic insulating layer;

a second organic insulating layer formed over the first organic insulating layer and covering edges of the pixel electrode, the second organic insulating layer comprising a third opening that overlaps with the second opening when viewed in the viewing direction;

a light emission layer formed over the pixel electrode; and an opposite electrode formed over the emission layer.

2. The organic light-emitting display apparatus of claim 1, wherein the pixel electrode is formed of a second transparent conductive oxide layer, a transflective metal layer, and a first transparent conductive oxide layer that are sequentially stacked on the substrate.

3. The organic light-emitting display apparatus of claim 2, wherein each of the first and second transparent conductive oxide layers comprises at least one material selected from the group consisting of indium tin oxide (ITO), indium zinc oxide (IZO), zinc oxide (ZnO), indium oxide (In2O3), indium gallium oxide (IGO), and aluminum zinc oxide (AZO).

4. The organic light-emitting display apparatus of claim 2, wherein the transflective metal layer comprises silver (Ag) or a silver alloy.

5. The organic light-emitting display apparatus of claim 1, wherein the first opening is larger than the second opening, and the second opening is larger than the third opening.

6. The organic light-emitting display apparatus of claim 1, wherein the buffer layer comprises a silicon nitride layer, and the pixel electrode directly contacts the silicon nitride layer.

7. The organic light-emitting display apparatus of claim 1, further comprising a pad electrode formed of the same material as the source electrode or the drain electrode.

8. The organic light-emitting display apparatus of claim 7, further comprising a protective layer disposed over the pad electrode.

9. An organic light-emitting display apparatus comprising:

a substrate comprising a major surface;

a buffer layer formed over the substrate;

a thin-film transistor formed over the buffer layer, and comprising an active layer, a gate electrode, a source electrode, and a drain electrode;

a gate insulating layer formed between the active layer and the gate electrode;

an interlayer insulating layer formed between the gate electrode and the gate insulating layer such that the gate electrode is disposed between the gate insulating layer and the interlayer insulating layer;

a first opening formed through the gate insulating layer and the interlayer insulating layer, wherein the first opening does not overlap with the thin-film transistor when viewed in a viewing direction perpendicular to the major surface;

a first organic insulating layer formed over the interlayer insulating layer and covering the source and drain electrodes, the first organic insulating layer comprising a second opening that overlaps with the first opening when viewed in the viewing direction;

a pixel electrode formed in the second opening, and directly contacting the buffer layer;

a second organic insulating layer formed over the first organic insulating layer and covering edges of the pixel electrode, the second organic insulating layer comprising a third opening that overlaps with the second opening when viewed in the viewing direction;

a light emission layer formed over the pixel electrode; and an opposite electrode formed over the emission layer, wherein the buffer layer comprises a silicon oxide layer and a silicon nitride layer that are sequentially stacked over the substrate, wherein the silicon oxide layer is disposed between the substrate and silicon nitride layer.

10. The organic light-emitting display apparatus of claim 9, wherein a thickness of the silicon nitride layer is greater than a thickness of the silicon oxide layer.

11. The organic light-emitting display apparatus of 9, wherein the first opening is formed further through the silicon nitride layer, and the pixel electrode directly contacts the silicon oxide layer.

12. The organic light-emitting display apparatus of claim 11, wherein the silicon oxide layer comprises a first portion located between the pixel electrode and the substrate and contacting the pixel electrode, wherein the silicon oxide layer comprises a second portion located between the silicon nitride layer and the substrate, wherein the first portion has a thickness smaller than that of the second portion.

13. An organic light-emitting display apparatus comprising:

a substrate comprising a major surface;

a buffer layer formed over the substrate;

a thin-film transistor formed over the buffer layer, and comprising an active layer, a gate electrode, a source electrode, and a drain electrode;

a gate insulating layer formed between the active layer and the gate electrode;

an interlayer insulating layer formed between the gate electrode and the gate insulating layer such that the gate electrode is disposed between the gate insulating layer and the interlayer insulating layer;

a first opening formed through the gate insulating layer and the interlayer insulating layer, wherein the first opening does not overlap with the thin-film transistor when viewed in a viewing direction perpendicular to the major surface;

a first organic insulating layer formed over the interlayer insulating layer and covering the source and drain electrodes, the first organic insulating layer comprising a second opening that overlaps with the first opening when viewed in the viewing direction;

a pixel electrode formed in the second opening, and directly contacting the buffer layer;

a second organic insulating layer formed over the first organic insulating layer and covering edges of the pixel electrode, the second organic insulating layer comprising a third opening that overlaps with the second opening when viewed in the viewing direction;

a light emission layer formed over the pixel electrode;

an opposite electrode formed over the emission layer; and a capacitor that comprises a first capacitor electrode formed of the same material as the gate electrode, and a second capacitor electrode formed of the same material as the source electrode.

14. The organic light-emitting display apparatus of claim 13, further comprising a protective layer disposed over each of the source electrode, the drain electrode, and the second capacitor electrode.

* * * * *